(12) United States Patent
Kocon

(10) Patent No.: US 6,376,878 B1
(45) Date of Patent: Apr. 23, 2002

(54) MOS-GATED DEVICES WITH ALTERNATING ZONES OF CONDUCTIVITY

(75) Inventor: Christopher B. Kocon, Plains, PA (US)

(73) Assignee: Fairchild Semiconductor Corporation, South Portland, MA (US)

( * ) Notice: Subject to any disclaimer, the term of this patent is extended or adjusted under 35 U.S.C. 154(b) by 0 days.

(21) Appl. No.: 09/502,712

(22) Filed: Feb. 11, 2000

(51) Int. Cl.$^7$ ............................................... H01L 29/72

(52) U.S. Cl. ..................... 257/328; 257/288; 257/335; 257/401

(58) Field of Search ............................. 257/288, 335, 257/401, 328

(56) References Cited

U.S. PATENT DOCUMENTS 5,216,275 A * 6/1993 Chen ........................ 257/493

* cited by examiner

Primary Examiner—Edward Wojciechowicz
(74) Attorney, Agent, or Firm—Jaeckle Fleischmann & Mugel, LLP

(57) ABSTRACT

This disclosure describes variety of MOS gated devices constructed with alternating conductivity type lower zones. These zones are used for depleting charge when blocking voltage is applied. When alternating zones are incorporated in the devices they allow use of a much higher conductivity material for drain construction, which in turn reduces device on-resistance and improves their efficiency. The method of creation of these new innovative structures with very small sizes (cell pitches) is also proposed.

12 Claims, 13 Drawing Sheets

MOS-GATED DEVICES WITH ALTERNATING ZONES OF CONDUCTIVITY

BACKGROUND

FIGS. 1 and 2 show cross sectional portions of a prior art trench n-type MOSFET device (FIG. 1) and a prior art surface gate MOSFET device (FIG. 2). In FIG. 1 the MOSFET includes a gate region constructed inside a trench with gate dielectric located on all its sides. The trench is filled with polysilicon that is used as a gate electrode. Source connection is achieved using thick top metal, through the gate-source dielectric opening, by direct silicon source and body regions contact. The backside of the N+ substrate is used as a drain contact. Current travel in a vertical direction from the source regions, along a channel parallel to the sidewalls of the gate trench and to the backside drain. FIG. 2 shows a similar prior art N-channel MOSFET in planar form. The gate region now is formed on top of the silicon surface instead of being recessed in the trench. Current also flows vertically from the source regions, beneath the gate and to the backside drain. While the drawings show construction of only one MOSFET, those skilled in the art understand it is conventional to repeat the structure of a typical device many times to form an array of devices. The array may be configured in various cellular or stripe layouts currently used by the industry. These types of devices have been long known. Recent manufacturing improvements have increased the densities of the trench gated devices. Higher density is desired because it allows manufacturers to make devices that are smaller but handle high currents. However, the increased density does not significantly improve power loss in mid to high ranged devices of 60 volts to 2000 volts. Since most of the loss is due to epi resistivity, which is set by desired breakdown voltage, the power losses are caused by the high resistivity of the drain regions. The resistivity of the drain must be kept high in order to block the device from conducting when the gate is turned off. However, a high resistivity for blocking voltage has the unwanted effect of increasing the on-resistance of the device. As a result, the denser devices have significant power loss. Since a high blocking voltage is a critical feature of power MOSFETs, increasing drain doping is not an option. Others have attempted to solve this problem by providing layers of alternate conductivity between the source regions and the drain. For examples of conventional solutions see U.S. Pat. Nos. 5,216,275 and 5,438,215. The layers of alternating conductivity increase the breakdown voltage of the device and thus allow for higher doping of the drain zone to reduce the on-resistance. However, the prior art solutions have drawbacks. In both patents the alternating layers are inserted before all diffused regions are formed. As these regions are activated with a thermal diffusion step, the alternating layers also diffuse. Some of the alternating layers are made by trenching and epitaxial deposition of doped silicon. Those structures are unreliable and often crack or separate during subsequent processing. This reduces their effectiveness.

SUMMARY

In order to reduce drain resistance without affecting the device blocking capability, an additional opposite polarity doping zone is added and spaced next to the drain zone. This zone extends from the top surface and it is shorted to the upper source metal. The zone is added after all of the thermal diffusions steps are completed and activated. In order to create this zone and minimize the lateral diffusion of dopants into the upper drain region spaced next to it, a new method is proposed which includes trench silicon etching, doping and dielectric trench fill. The zone is constructed using conventional trench techniques. The exposed trench sidewalls are doped from a solid, liquid or gaseous source and the trench is filled with an insulator that is deposited at low temperature. When the device is in the blocking state both zones will contribute charges with opposite signs, but the induced fields in both zones will cancel out. This allows for use of a much higher doping for both zones and specifically in the drain zone. Current flowing through drain zone now sees a much lower resistance drop which in turn will reduce the device overall on-resistance and improve its efficiency.

The invention provides a unique structure for a MOS-gated semiconductor device. The structure includes a substrate of semiconductor material having opposite top and bottom surfaces. The top surface has a pair of well regions of a first conductivity and a pair of source regions of a second conductivity. A gate and channel region are located between the respective pairs of well and source regions. Beneath the wells and sources is a drift region of a second conductivity. The drift region is adjacent a highly doped drain a second conductivity that extends from the drift region to the opposite surface of the substrate. A pair of extended well regions extend from distal ends of the wells through a substantial portion of the drift region in a direction toward the drain region. The extended well regions are formed adjacent the sidewalls of trenches. The sidewalls are doped with dopants of a first conductivity that generate opposing induced electrical fields at their respective junctions with the drain zone. The trenches are filled with insulating material, such as silicon dioxide.

The method of trench construction is conventional. However, the timing of the trench construction is optimized by constructing the trenches after the body, well and source are in place and all other major diffusions steps are completed. Then the diffusion of the dopants from the sidewalls can be tightly controlled to generate the proper doping profile and keep the lateral diffusion close to the sidewall. The insulator that fills the trench is formed at low temperatures using, for example, conventional low temperature oxide deposition. Such a step does not adversely affect the doping profile of the extended well regions that are adjacent the sidewalls of the trenches.

DRAWINGS

DETAILED DESCRIPTION

Figure 1:
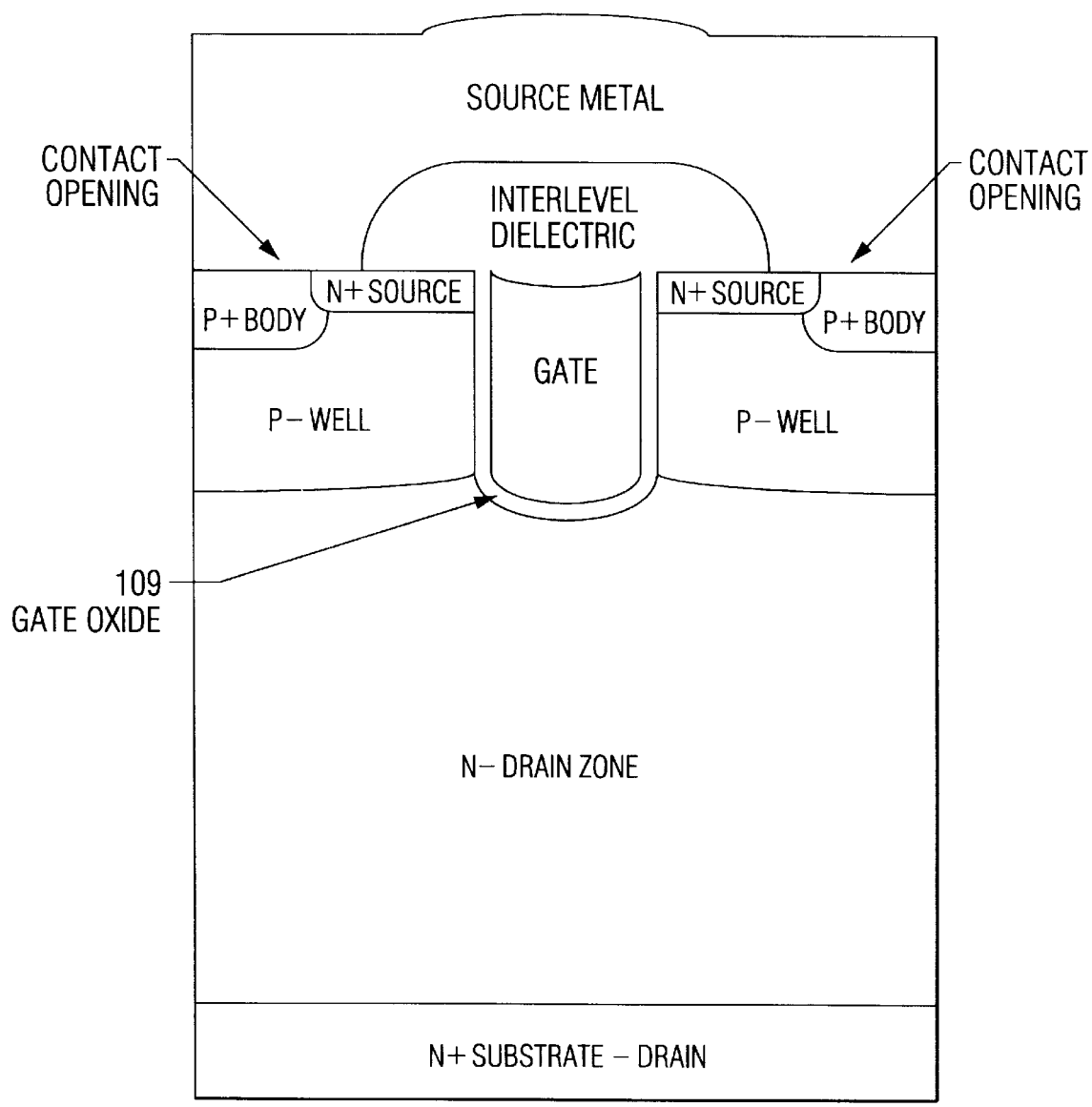
FIGS. 1 and 2 are cross sections of prior art MOSFET devices.
Figure 2:
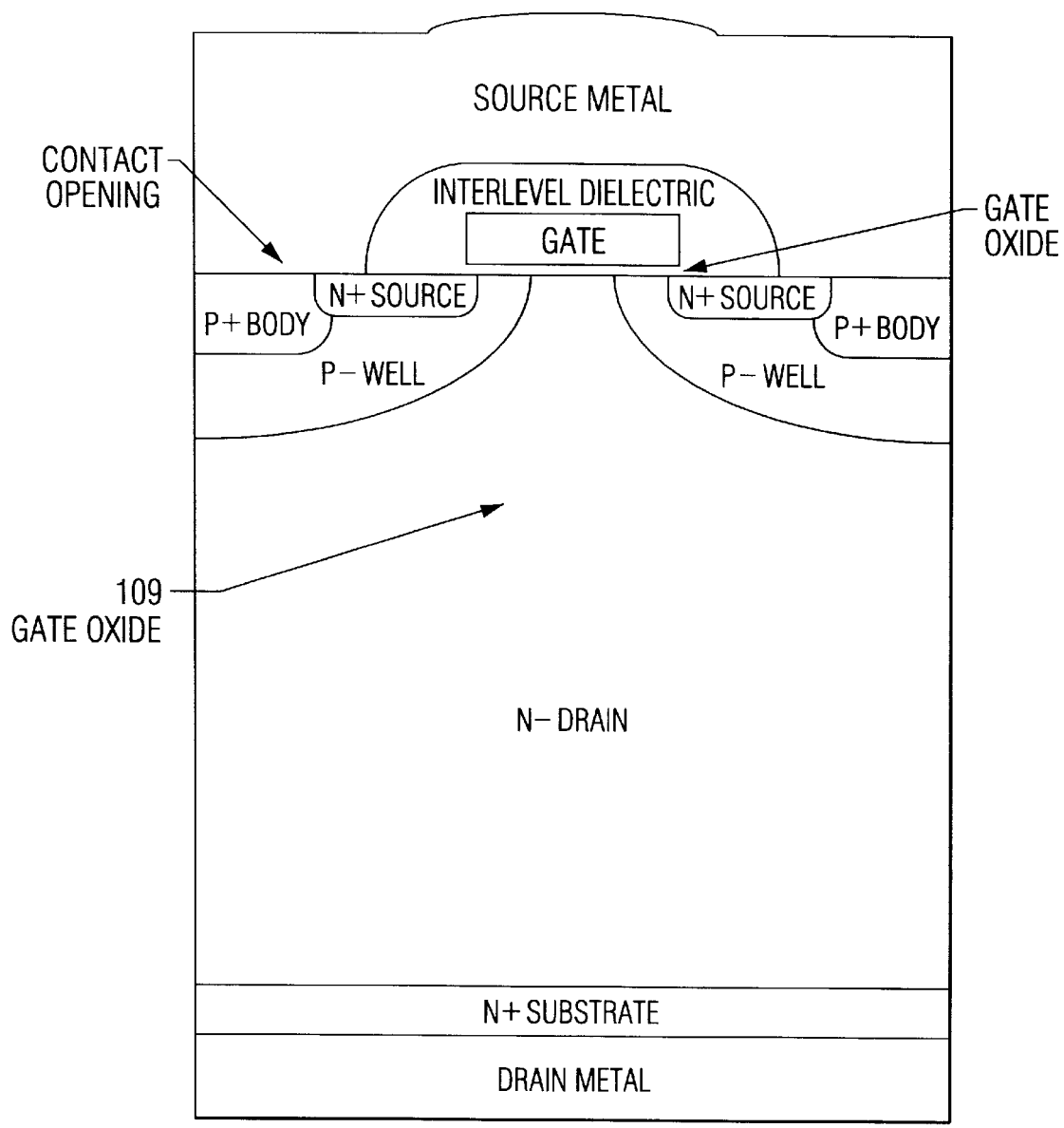
Figure 3:
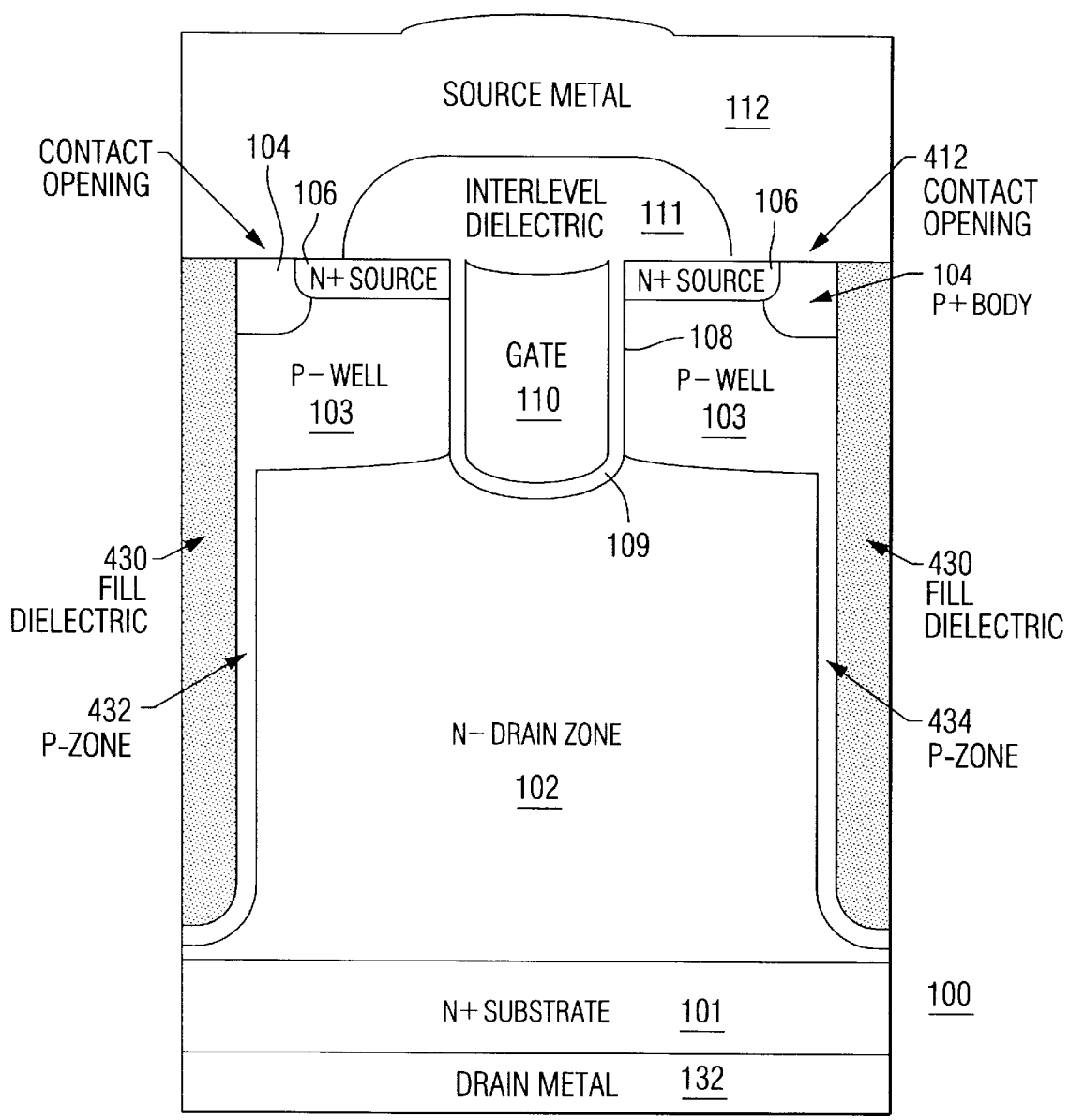
FIGS. 3 and 4 are cross sections of MOSFETS that include the invention.

The MOSFET 100 includes a substrate 101 of highly doped N semiconductor (silicon) material. An epitaxial layer 102 of N type material forms a drain zone 102. On the top surface of layer 102 is a P-type well region 103. Within the P-type well region 103 is a N+ source region. A gate structure includes trench 108 that has a sidewall oxide insulator 109 lining the trench and a conductive filling 110 of doped polysilicon. P+ body contacts 104 are provided in the surface of the P well region 104. Extended well zones 432, 434 extend from distal ends of the P-well 103 through a substantial portion of the drain zone 102 in a direction toward the N+ substrate 101. The extended well zones 432, 434 are formed in the sidewalls of trenches 152, 153. The trenches 152, 153 are filled with a low temperature insulator, typically silicon dioxide 430. Contact to the device is made through the source metal 112 that contacts the top surface source and body regions, the drain metal 132 that contact the N+ substrate 101 and separate gate electrode 110.

Figure 4:
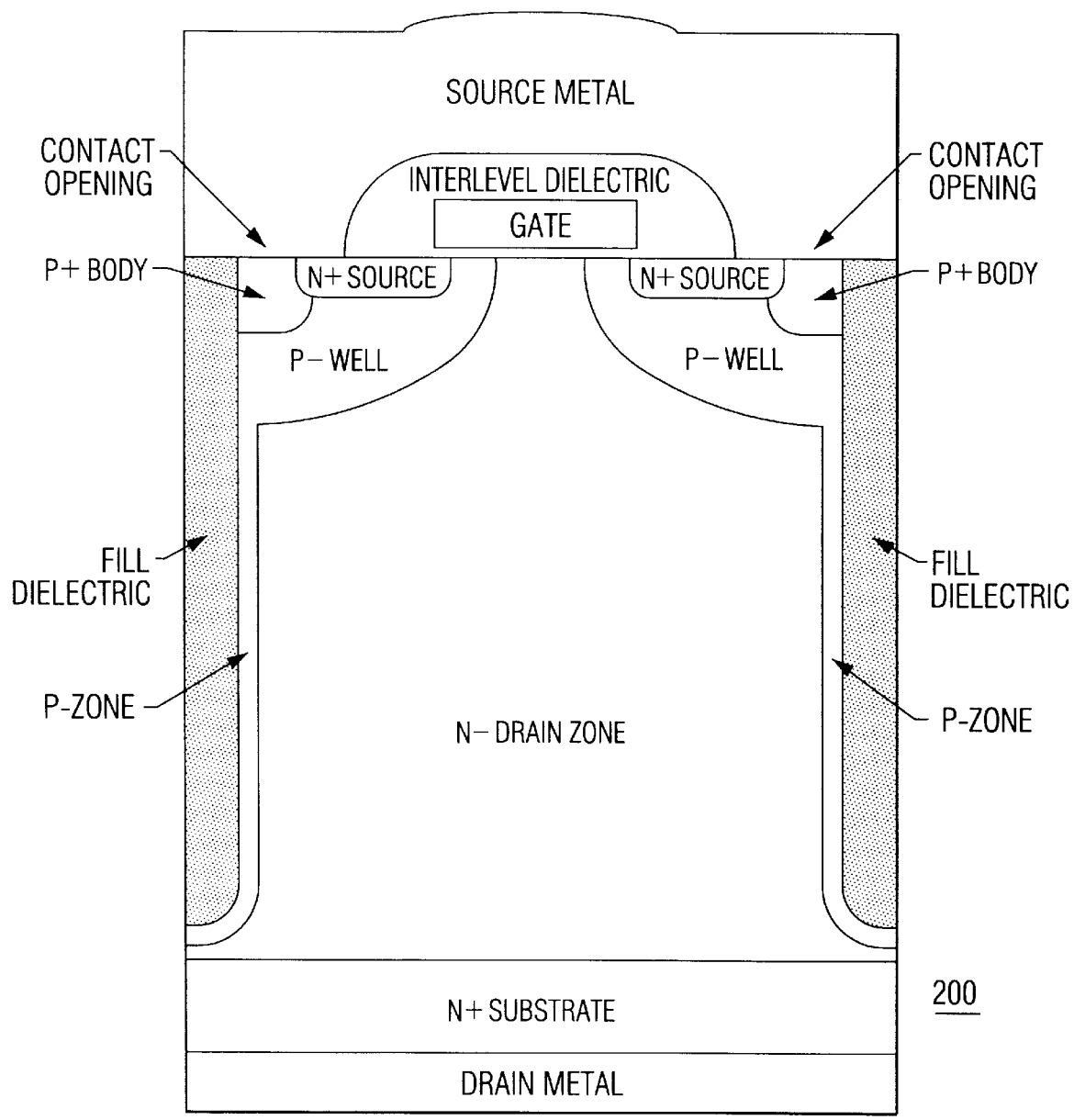
Figure 5:
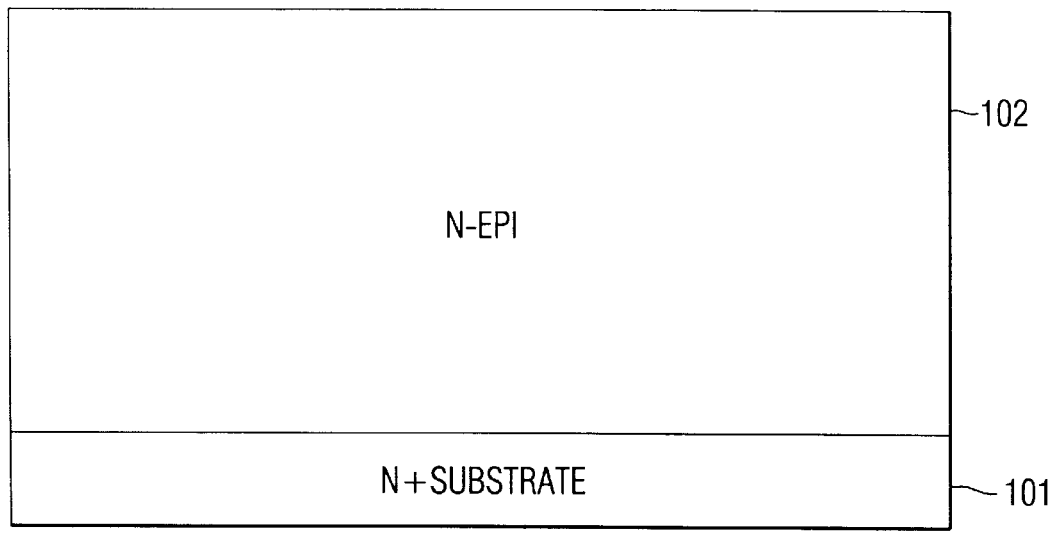
FIGS. 5–20 depict the steps of a prior art process for forming the trench MOSFET device of FIG. 3.
Figure 6:
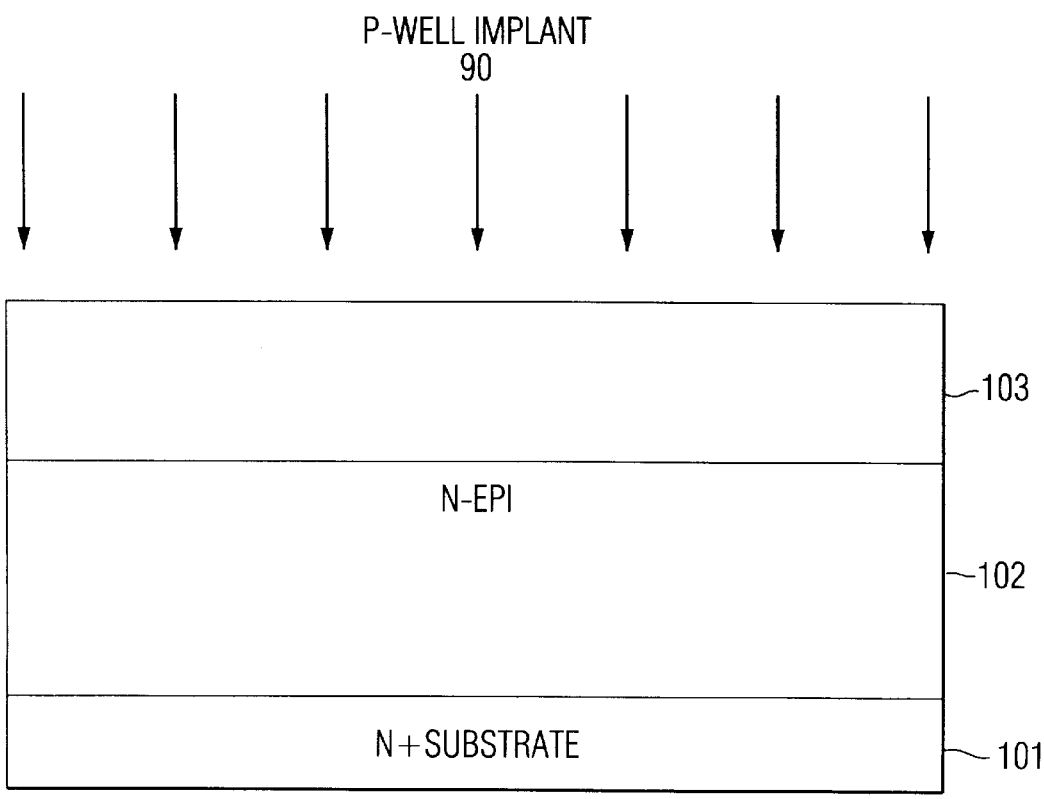
Figure 7:
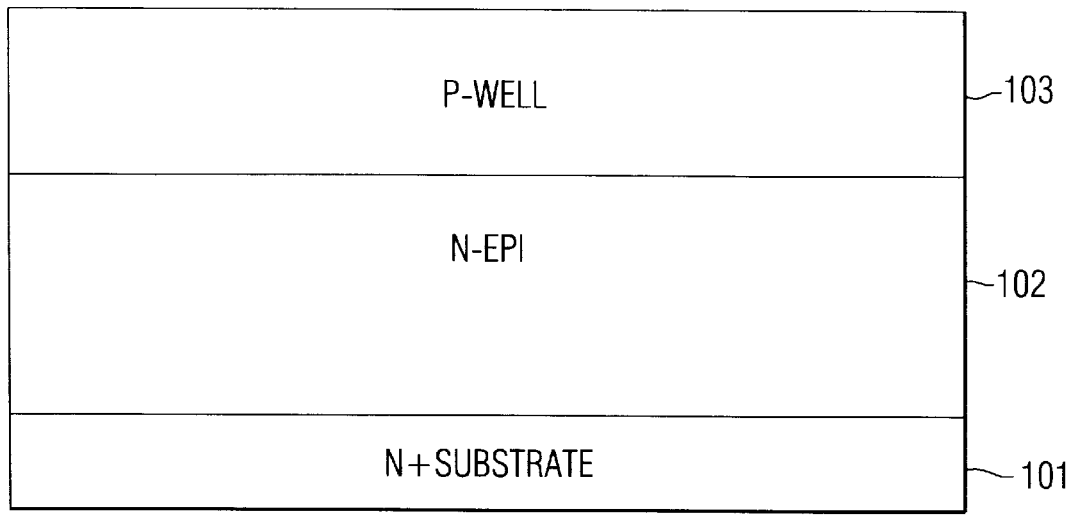
Figure 8:
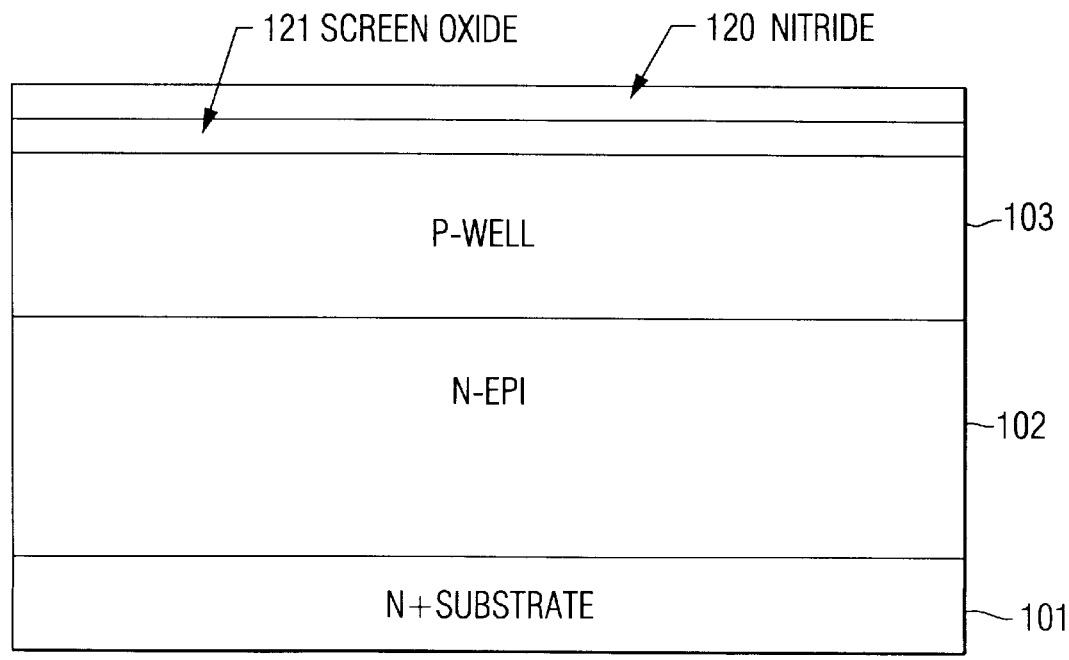
Figure 9:
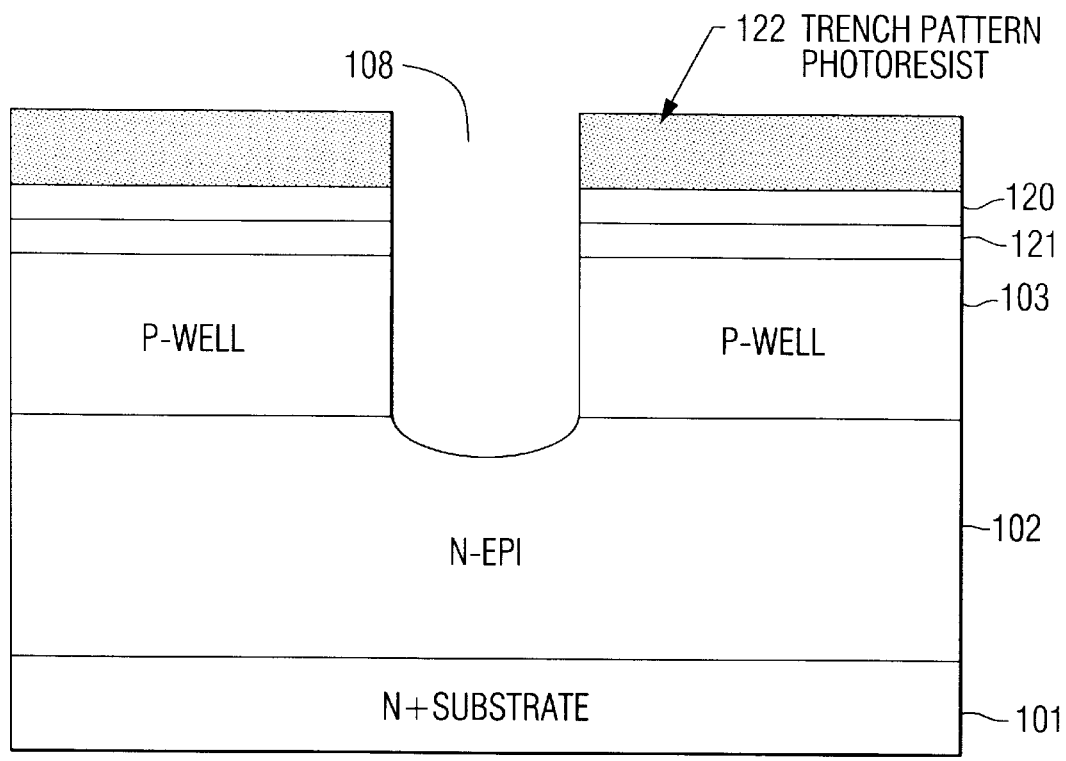
Figure 10:
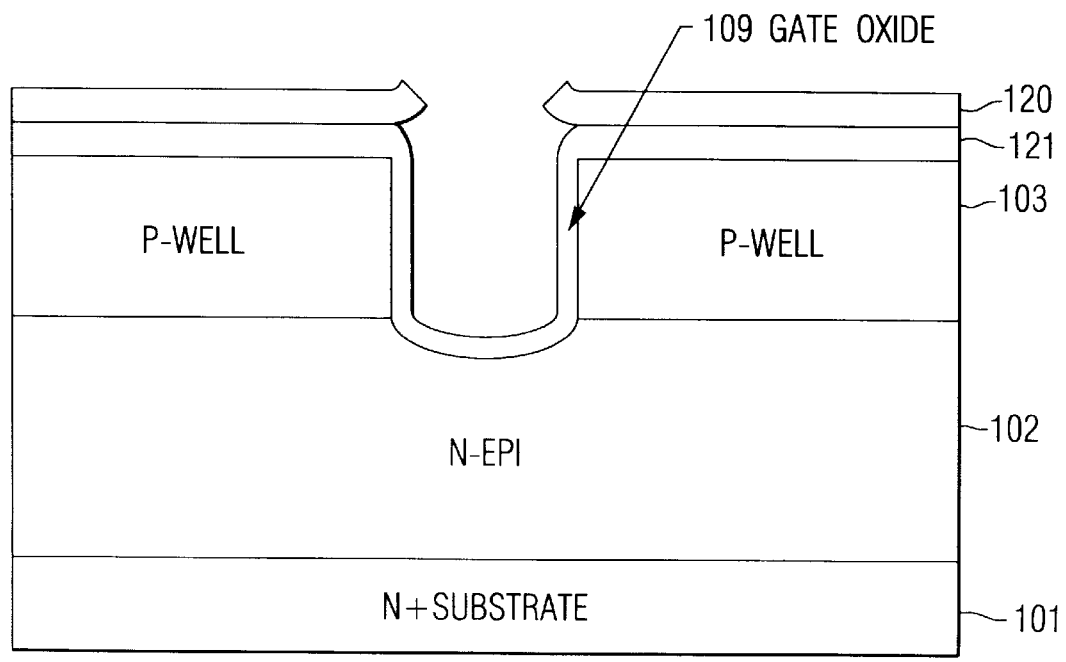
Figure 11:
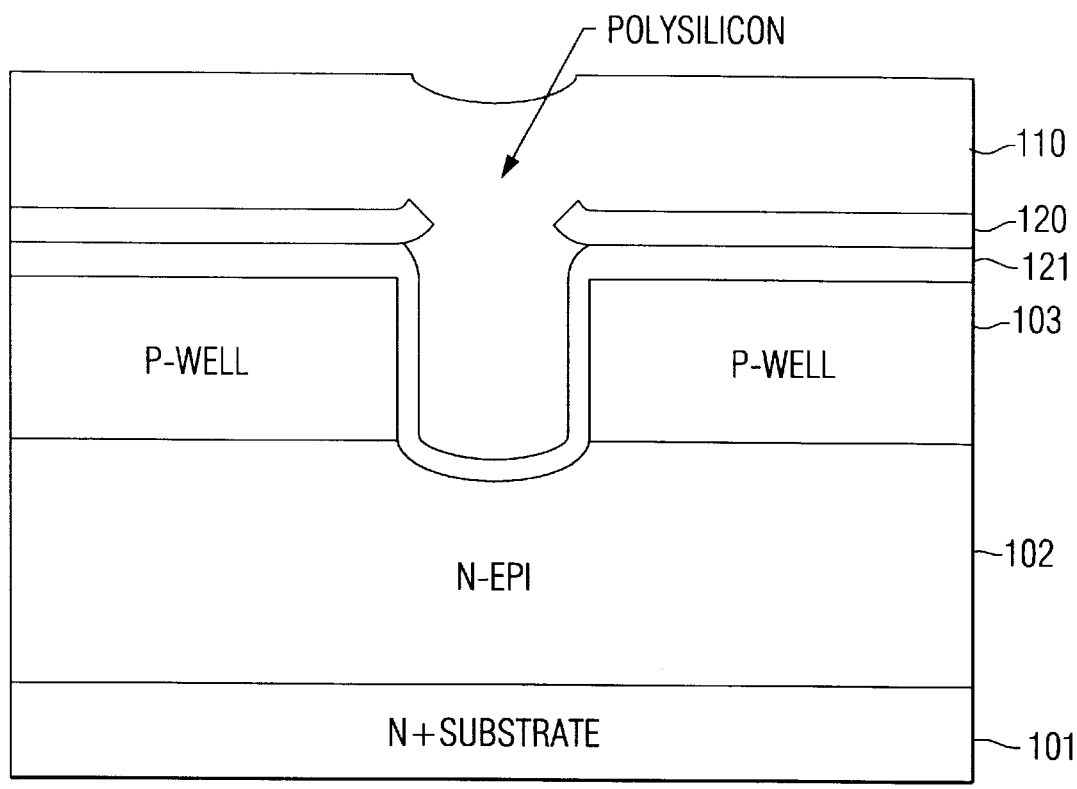
Figure 12:
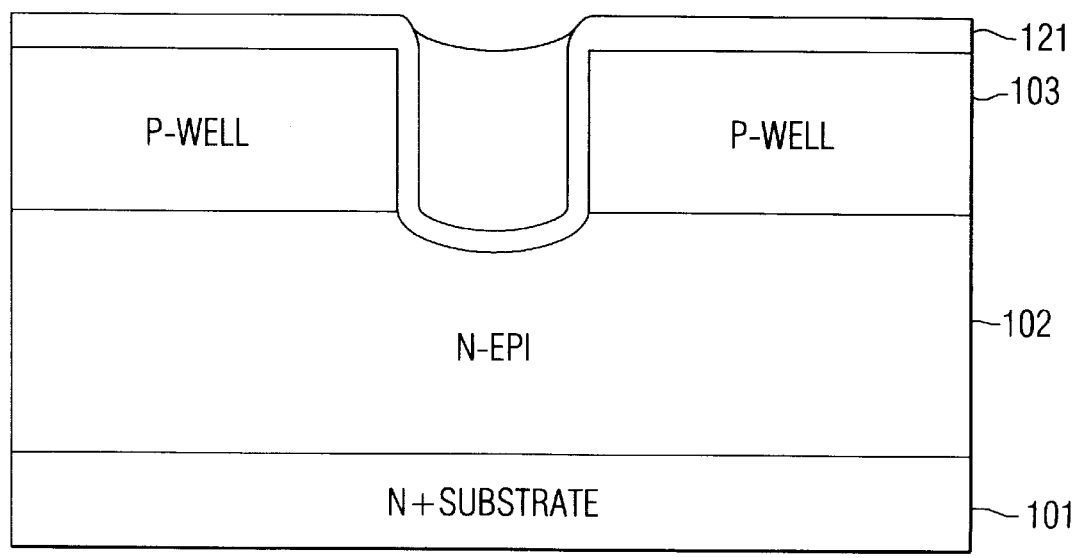
Figure 13:
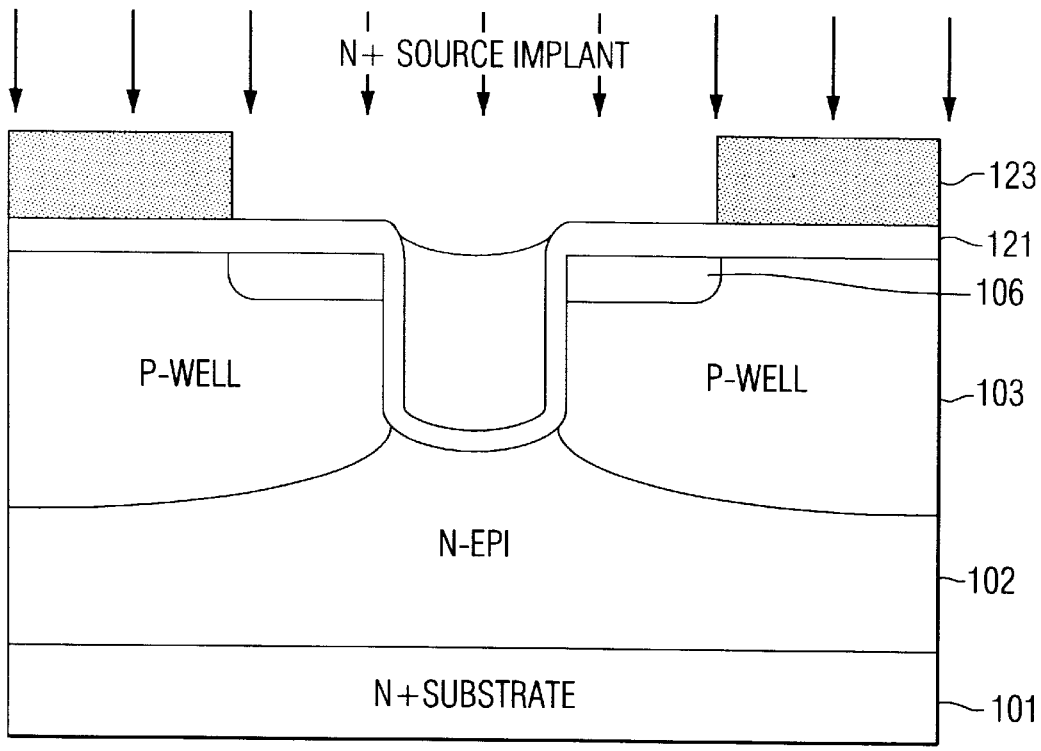
Figure 14:
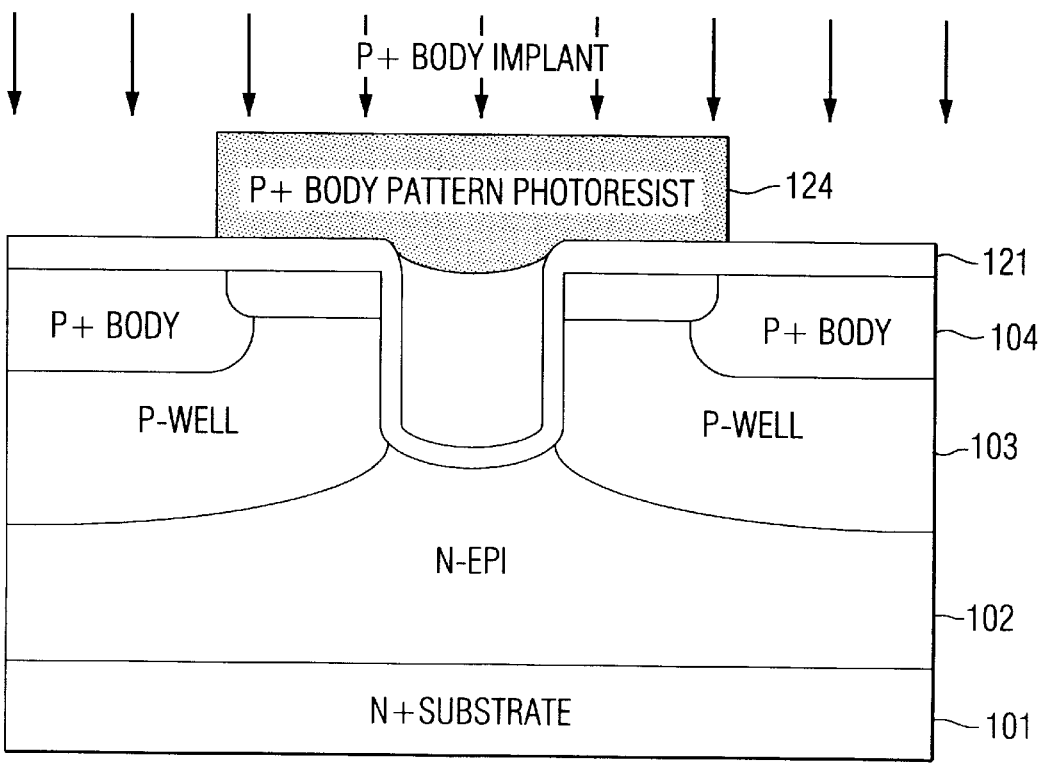
Figure 15:
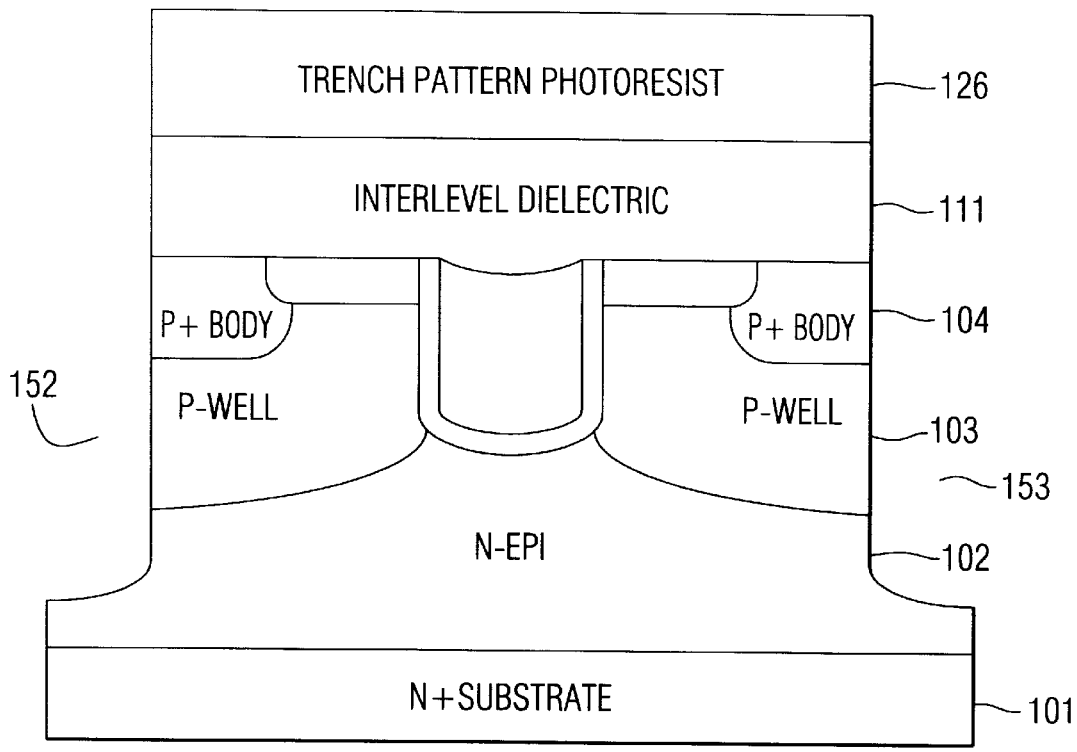
Figure 21:
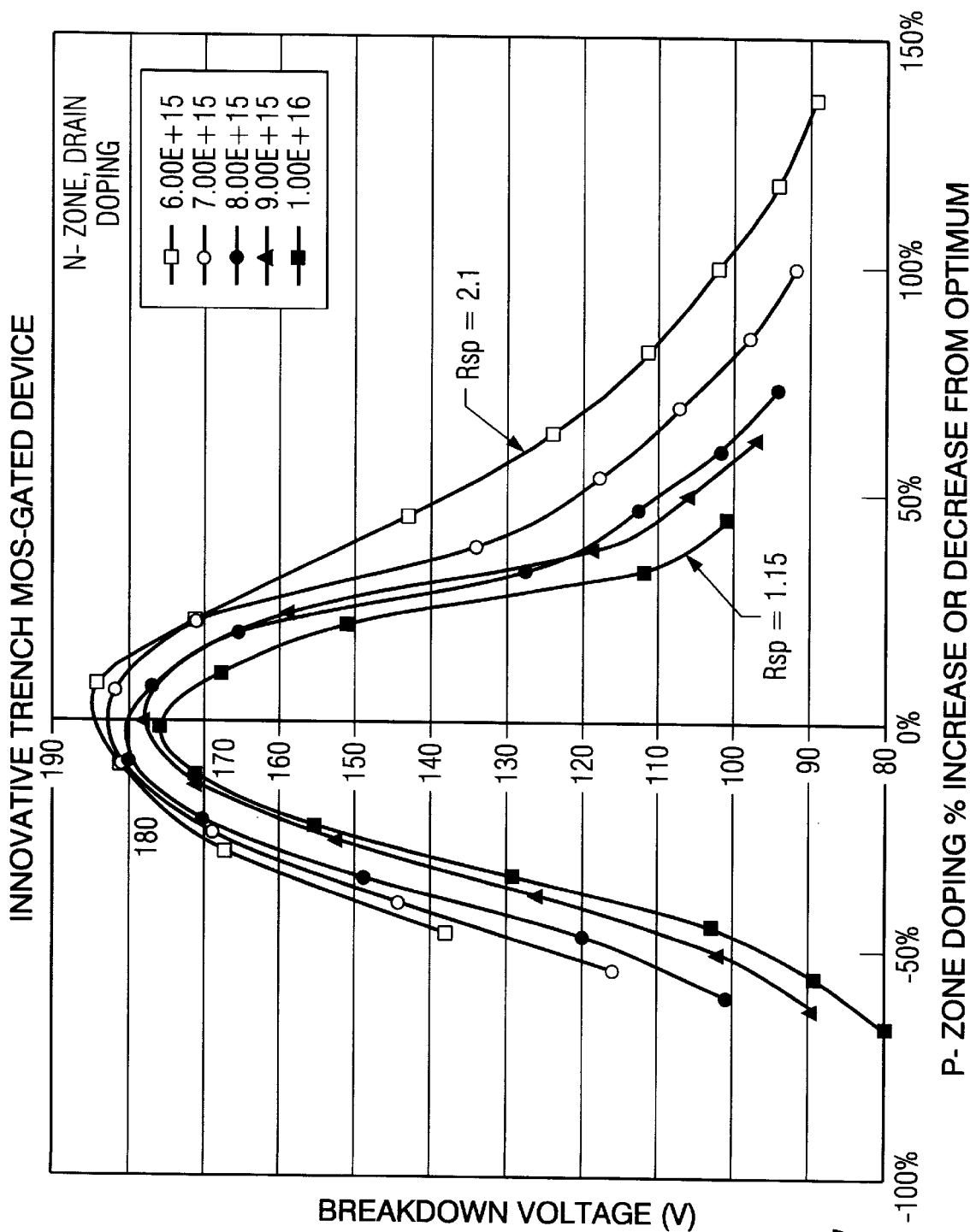
FIG. 21 shows simulated results for sensitivity of breakdown voltage to P-zone doping.

When device 100 is in a blocking (off) state, a positive voltage is applied to the drain terminal 132, thereby reverse biasing the diode formed by P well 103 and N drain 102. With no voltage applied to the gate electrode 110, there is no channel for current to flow between the drain and source electrodes. Since the P-well/N-drain diode is reverse biased, a depletion region containing an electric field is formed. In the blocking state both extended zones 432, 434 contribute charges with opposite signs, but the induced fields in both zones cancel each other out. This allows for use of a much higher doping for both zones and specifically in the drain zone 102. When device is in conduction (on) state, current flowing through drain zone 102 now sees a much lower resistance drop which in turn will reduce the device overall on-resistance and improve its efficiency. A second embodiment of the invention with a surface gate is shown in FIG. 4. FIG. 21 shows simulation results demonstrating the sensitivity of breakdown voltage to P-zone 432,434 doping.

FIGS. 5–20 show a procedure for building a trench MOSFET device 100. First, deposit on a highly doped N+ substrate 101 an N-doped epitaxial layer 102 having the thickness and resistivity characteristics needed for a desired breakdown voltage. Next, a blanket P-well implant 90 is performed, thereby creating a P-well 103. A heating step increase the depth of the P-well and activates the P dopants. Next a trench mask if formed. The mask is made by depositing of growing a screen oxide layer 121 followed by a silicon nitride layer 120. A photoresist layer 122 is deposited on top of the nitride layer. The photoresist, nitride and oxide layers are processed and patterned to define a trench opening 108. Silicon is removed from the trench 108 to form the gate. The exposed sidewalls of the trench 108 are oxidized or coated with an oxide 109. Then a layer of polysilicon 110 is deposited on the substrate to fill the trench. The polysilicon layer 110 is planarized and the nitride layer 120 is removed.

An N+ source 106 is formed by source mask 123 of photoresist. The opening in the resist exposes the gate polysilicon 110 and the source regions 106 to an N+ ion implant to form the source 106 and dope the gate 110 to be conductive. As such, the gate and the source implants are self-aligned. The mask 123 is stripped and another, body mask 124 is formed over the source and gate. A P+ body implant is performed. The body mask 124 is stripped and an interlevel dielectric layer 111 is uniformly deposited over the surface of the substrate.

The interlevel dielectric material 111 is typically borophosphosilicate glass (BPSG) or phosphosilicate glass (PSG). A trench etch photomask 126 is formed over the interlevel dielectric 111. The extended well trenches 152, 153 are formed in the regions not covered by the mask 126. Those skilled in the art understand that the drawing shows only half of the left and right trenches 152, 152. After exposure to a light source, the photoresist is heated. Exposed photoresist becomes hard and unexposed photoresist remains soft. The latter is readily removed by conventional solvents. The remaining photoresist forms a trench mask that defines trench openings 152, 153. A suitable wet or dry silicon etch is performed to create the trenches 152,153. The depth of the trenches 152,153 depends upon the thickness of the drain 102 and the substrate 101 and the desired breakdown voltage. In general, the deeper the trenches 152, 153, the higher the breakdown voltage. After the trenches are in place, a suitable P-type dopant is introduced into the sidewalls of the trench to form extended well regions 432,434. The source of the dopant may be a gas, liquid or a solid deposited on the walls of the trench, including P-doped polysilicon that partially fills the trench. A heating step is used to activate the dopant and place it in a region surrounding the trenches. After the dopant is in place, the trench is filled with a conventional insulator, such as silicon dioxide 430. The insulator is typically deposited at a low temperature. Those skilled in the art may select one of several known methods for low temperature oxide deposition. The temperature should be low enough to prevent unwanted lateral diffusion of the sidewall dopants 432, 434 into the drain zone 102. The insulator 430 is thermally compatible with the device substrate and will survive further processing.

Although the extended P zones 432, 434 are created just prior to source metal 112 deposition, the zones could formed at any point of device manufacture. It is preferred to form the zones at the end of the process in order to minimize the thermal budget (time at temperature) for P zone exposure and thereby minimize P zone diffusion into the N-drain zone 102. This in turn allows manufacture of smaller size devices with higher packing density and lower on resistance.

Figure 16:
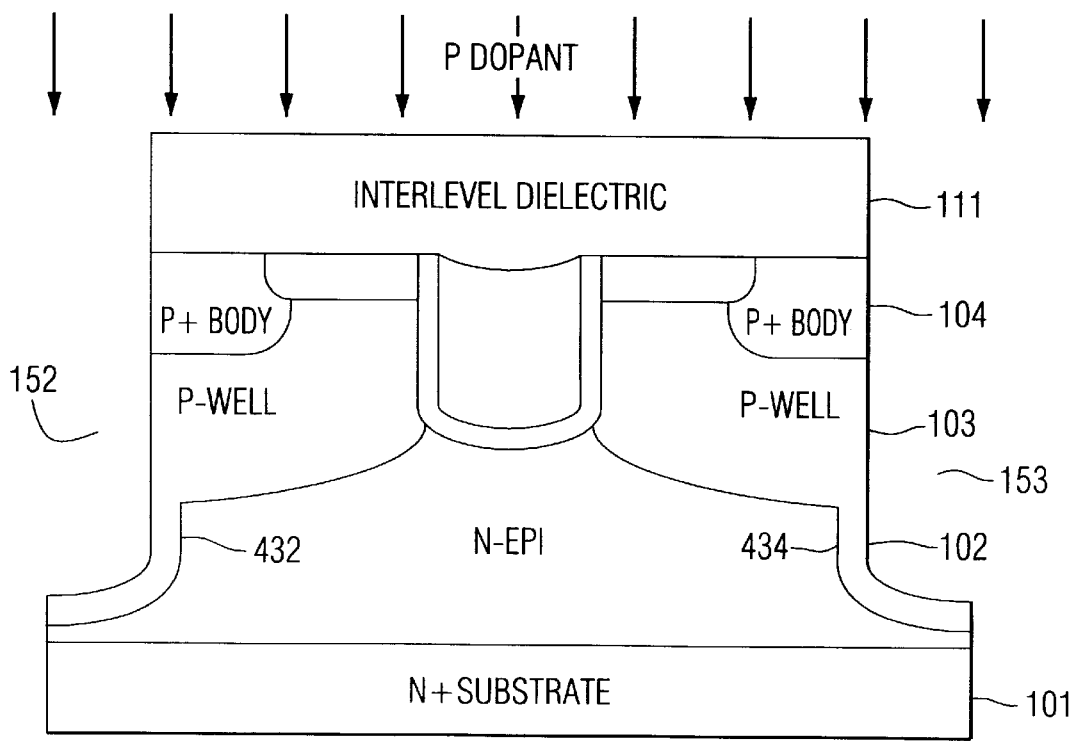
Figure 17:
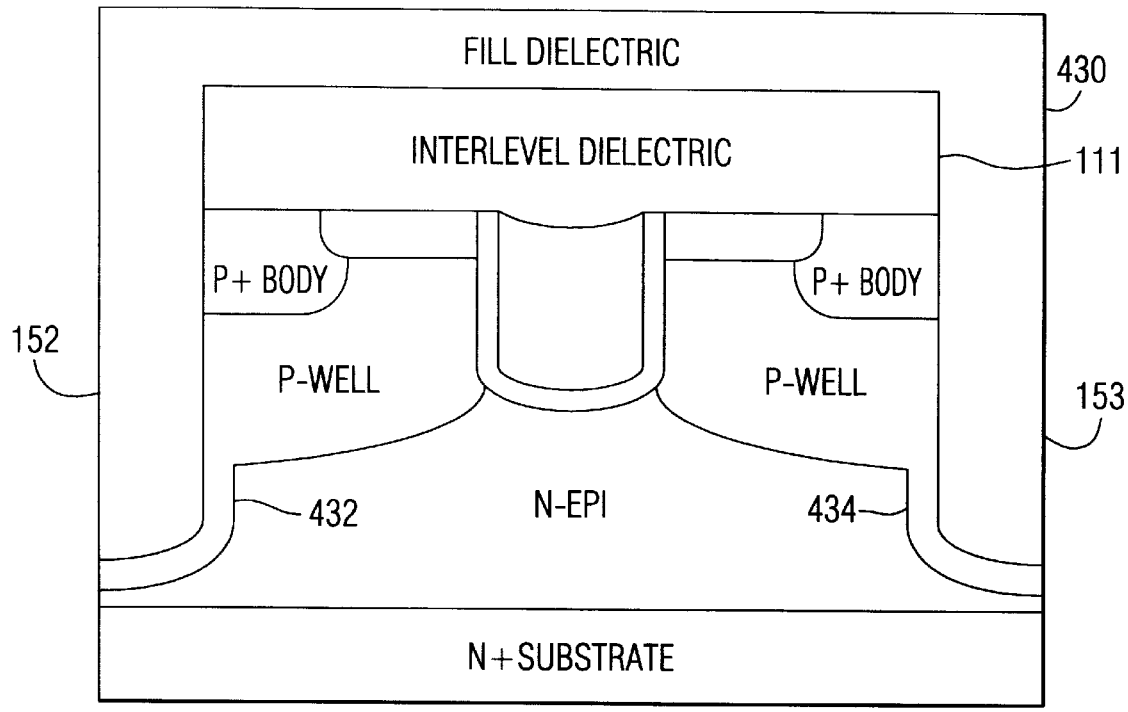
Figure 18:
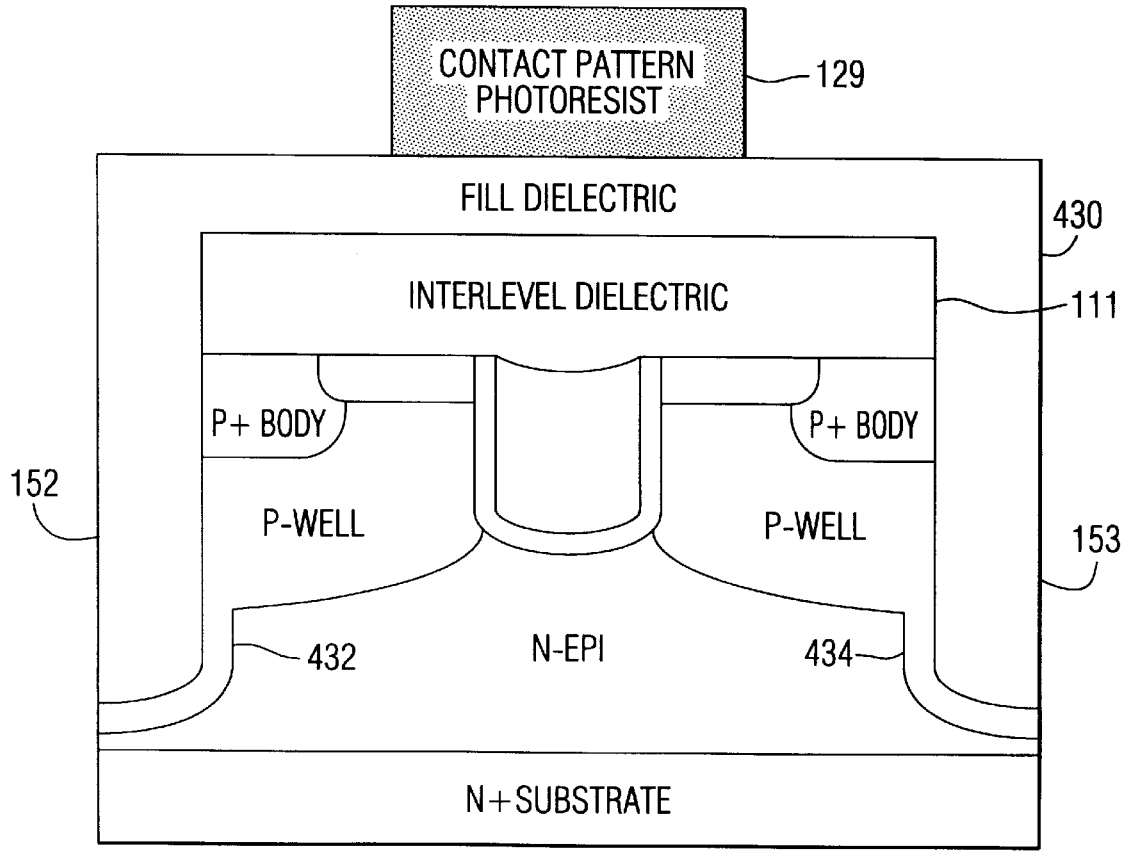
Figure 19:
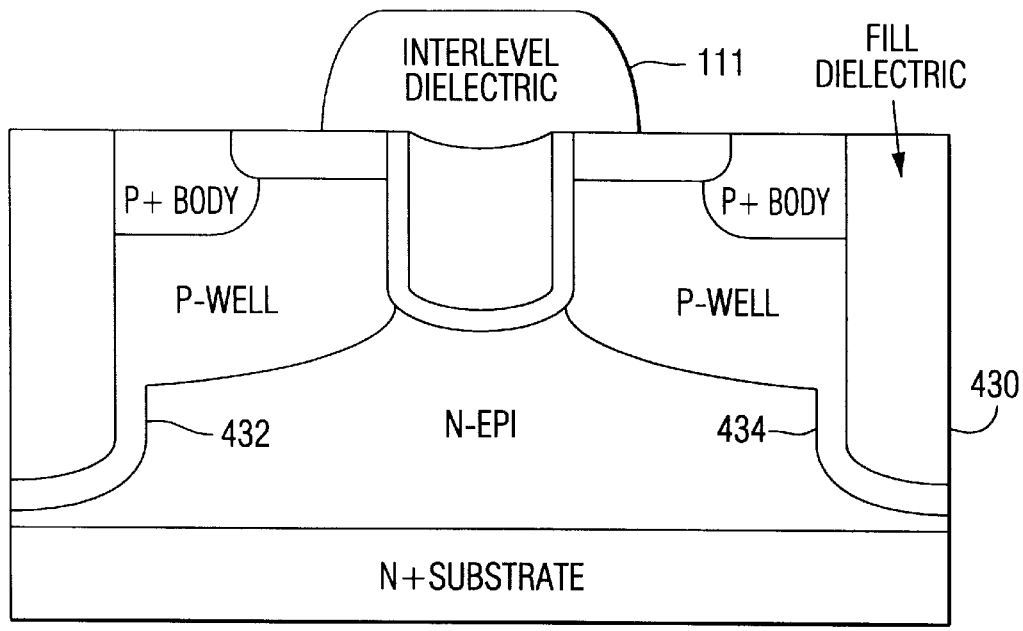
Figure 20:
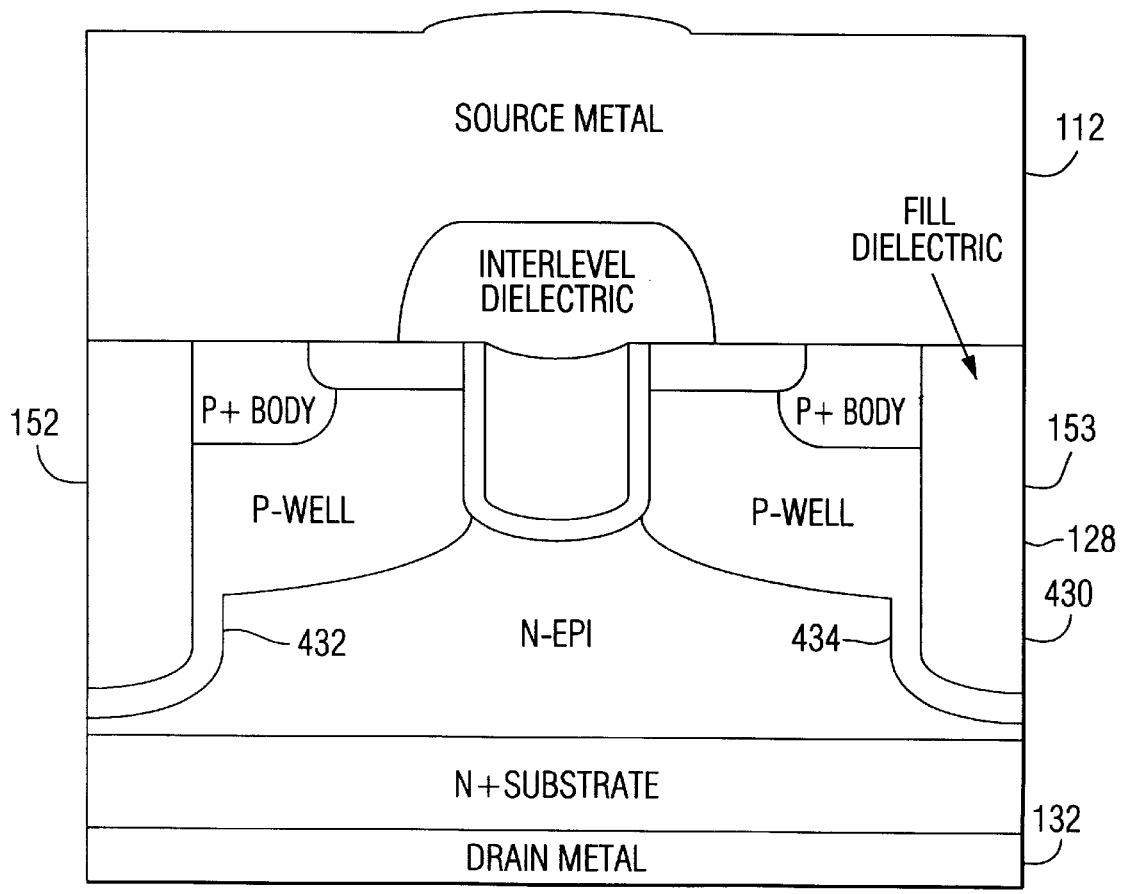

The fill dielectric layer 430 is next patterned with a contact defining photomask 129. The exposed portions of the fill dielectric layer and the interlevel dielectric are etched to expose the contact regions including the N+ source and the P+ body. The fabrication of device 100 is completed by depositing metal 112 on the top surface of the wafer to serve as a source/body contact and metal 132 on the back side to serve as a drain contact. Although the procedure outlines a specific process flow, variations are allowed and should not limit this disclosure. The innovation is described above as N-channel silicon MOSFET device. However, it could also be applied to P-type devices and to other devices and other semiconductor materials and dopants. The described device is power MOSFET but the same innovation applies to all MOS gated devices such as insulated gate bipolar transistors (IGBT) and MOS-gated thyristors. The planar version of the invention shown in FIG. 4 follows similar fabrication steps and uses conventional surface gate fabrication techniques. FIG. 16 shows the device 100 simulation results showing sensitivity of breakdown voltage to P-zone doping. It suggests that even at +−40% doping variation from optimum a successful 150V device can be manufactured with 3x lower on-resistance per unit area than presently available on the market devices with the same voltage rating.

What is claimed is:
1. A MOS-gated semiconductor device comprising:
   a substrate of semiconductor material having top and bottom surfaces;
   a well region of a first conductivity and extending to the top surface;
   a pair of source regions of a second conductivity, disposed in the well region and extending to the top surface;
   a gate and channel region disposed between the source regions;
   a drain zone of a second conductivity disposed beneath the gate the well region;
   a drain contact region of a second conductivity, highly doped, and extending from the drain zone to the opposite surface of the substrate;

a pair of extended well regions extending from distal ends of the well region in a direction through a substantial portion of the drain zone and in a direction toward the drain contact, said extended well regions proximate to but not contacting said drain contact region and having a first conductivity and generating opposing induced electrical fields at their respective junctions with the drain zone.

2. The MOS-gated power device of claim 1 further comprising a pair of trenches, each trench located at one of the distal ends of the well region, adjoining the extended well regions and extending from the top surface toward the bottom surface and penetrating the drain zone a substantial distance, each trench filled with insulating material.

3. The MOS-gated power device of claim 1 wherein the gated is located on the top surface of the device.

4. The MOS-gated power device of claim 1 wherein the gated is disposed in a trench separating the sources from each other.

5. The MOS-gated power device of claim 1 wherein the drain zone is more than moderately doped to reduce the on resistance of the device.

6. The MOS-gated device of claim 1 wherein the device is a MOS transistor.

7. The MOS-gated device of claim 1 wherein the device is an IGBT.

8. A method for fabricating a MOS-gated comprising:

in a substrate of semiconductor material having top and bottom surfaces, forming a well region of a first conductivity extending to the top surface;

forming a pair of source regions of a second conductivity, disposed in the well region and extending to the top surface;

forming a gate and channel region disposed between the source regions;

forming a drain zone of a second conductivity disposed beneath the gate the well region;

on the bottom surface of the substrate, forming a contact region of a second conductivity, highly doped, and extending from the drain zone to the opposite surface of the substrate;

etching a pair of trenches on opposite distal ends of the well region and extending from the top surface of the substrate toward the bottom surface and penetrating the drain zone a substantial distance;

doping the sidewalls of the trenches with a first conductivity dopant to form a pair of extended well regions extending from distal ends of the well in a direction through a substantial portion of the drain zone and in a direction toward the drain contact region, said extended source regions having a first conductivity and generating opposing induced electrical fields at their respective junctions with the drift region; and filling the trenches with insulating material.

9. The method of claim 8 wherein the dopant on the sidewalls of the trench is deposited from a solid, liquid or gaseous source.

10. The method of claim 8 wherein the dopant on the sidewalls of the trench is deposited, doped polysilicon.

11. The method of claim 8 wherein the extended well regions do not contact the drain contact region.

12. A MOS-gated semiconductor device comprising:

a substrate of semiconductor material having top and bottom surfaces;

a well region of a first conductivity and extending to the top surface;

a pair of source regions of a second conductivity, disposed in the well region and extending to the top surface;

a gate and channel region disposed between the source regions;

a drain zone of a second conductivity disposed beneath the gate the well region;

a drain contact region of a second conductivity, highly doped, and extending from the drain zone to the opposite surface of the substrate;

a pair of extended well regions extending from distal ends of the well region in a direction through a substantial portion of the drain zone and in a direction toward the drain contact, said extended well regions having a first conductivity and generating opposing induced electrical fields at their respective junctions with the drain zone;

a pair of trenches extending from the top surface toward the bottom surface and penetrating the drain zone a substantial distance, each trench adjoining one of the extended well regions and filled with insulating material.

* * * * *

UNITED STATES PATENT AND TRADEMARK OFFICE
CERTIFICATE OF CORRECTION

PATENT NO. : 6,376,878 B1
DATED : March 19, 2002
INVENTOR(S) : Shigeru Sawamura

It is certified that error appears in the above-identified patent and that said Letters Patent is hereby corrected as shown below:

Column 9,
Line 26, after "prism", insert -- and a second prism, said first prism being --.
Line 29, after "and", insert -- to --.
Line 30, delete the second instance of "a", and insert -- the --.
Line 37, delete "liht-absorbing", and insert -- light-absorbing --.
Line 53, after "the", insert -- second --.
Line 65, after "and", insert -- to --.

Column 10,
Lines 10 and 11, delete "second flat face opposite to the entrance face,", and insert -- second face which is flat and is opposite to the entrance face, --.
Line 21, after "the", insert -- first --.
Line 30, delete "wherein the prism", and insert -- further comprising a third prism which --.
Line 33, after the first instance of "the", insert -- third --.
Line 33, after the second instance of "the", insert -- illumination --.
Line 38, after "the", insert -- illumination --.
Line 52, after "prism", insert -- and a second prism, said first prism being --.
Line 58, delete "a", and insert -- the --.
Line 61, delete "a", insert -- said --.

Column 11,
Line 11, after "the", insert -- second --.
Lines 41 and 42, delete "second flat face opposite to the entrance face", and insert -- second face, which is flat and is opposite to the entrance face, --.
Lines 58-59, delete "claim 10, wherein the prism", and insert -- claim 10, further comprising a third prism which --.
Line 62, after the first instance of "the", insert -- third --.
Line 62, after the second instance of "the", insert -- illumination --.
Line 67, after "the", insert -- illumination --.

UNITED STATES PATENT AND TRADEMARK OFFICE
CERTIFICATE OF CORRECTION

PATENT NO. : 6,376,878 B1
DATED : March 19, 2002
INVENTOR(S) : Shigeru Sawamura

It is certified that error appears in the above-identified patent and that said Letters Patent is hereby corrected as shown below:

Column 12,
Line 30, delete "claim 1,", and insert -- claim 17, --.
Lines 34 and 35, after "comprising:", insert -- a first prism; --.
Lines 35, 38, 39 and 45, delete "spacial", and insert -- spatial --.
Line 35, after "modulator", delete ";", and insert -- positioned on one side of the first prism; --.
Line 36, delete the first instance of "a", and insert -- the --.
Lines 38 and 39, delete "positioned on one side of the first prism".
Lines 38 and 39, delete "spacial", and insert -- spatial --.
Line 40, after "modulator", insert -- being --.
Line 44, after "system", insert -- , positioned --.
Lines 45 and 46, delete "[the projection optical system]".
Line 48, after the first instance of "prism", insert -- positioned --.
Line 59, delete "[a]".

Column 13,
Line 8, after "directed;", insert -- a first prism; -- and -- a second prism --.
Line 9, delete "a", and insert -- the --.
Line 9, after "prism", insert -- being --.
Line 15, delete "a", and insert -- the --.
Line 18, delete "a", and insert -- said --.

Signed and Sealed this

Tenth Day of September, 2002

*Attest:*

JAMES E. ROGAN
*Attesting Officer*   *Director of the United States Patent and Trademark Office*

UNITED STATES PATENT AND TRADEMARK OFFICE
CERTIFICATE OF CORRECTION

PATENT NO.    : 6,376,878 B1
DATED         : March 19, 2002
INVENTOR(S)   : Shigeru Sawamura It is certified that error appears in the above-identified patent and that said Letters Patent is hereby corrected as shown below:

Column 9,
Line 26, after "prism", insert -- and a second prism, said first prism being --.
Line 29, after "and", insert -- to --.
Line 30, delete the second instance of "a", and insert -- the --.
Line 37, delete "liht-absorbing", and insert -- light-absorbing --.
Line 53, after "the", insert -- second --.
Line 65, after "and", insert -- to --.

Column 10,
Line 10 and 11, delete "second flat face opposite to the entrance face,", and insert -- second face which is flat and is opposite to the entrance face, --.
Line 21, after "the", insert -- first --.
Line 30, delete "wherein the prism", and insert -- further comprising a third prism which --.
Line 33, after the first instance of "the", insert -- third --.
Line 33, after the second instance of "the", insert -- illumination --.
Line 38, after "the", insert -- illumination --.
Line 52, after "prism", insert -- and a second prism, said first prism being --.
Line 58, delete "a", and insert -- the --.
Line 61, delete "a", and insert -- said --.

Column 11,
Line 11, after "the", insert -- second --.
Lines 41 and 42, delete "second flat face opposite to the entrance face", and insert -- second face, which is flat and is opposite to the entrance face, --.
Lines 58 and 59, delete "claim 10, wherein the prism", and insert -- claim 10, further comprising a third prism which --.
Line 62, after the first instance of "the", insert -- third --.
Line 62, after the second instance of "the", insert -- illumination --.
Line 67, after "the", insert -- illumination --.

UNITED STATES PATENT AND TRADEMARK OFFICE
CERTIFICATE OF CORRECTION

PATENT NO.    : 6,376,878 B1
DATED         : March 19, 2002
INVENTOR(S)   : Shigeru Sawamura It is certified that error appears in the above-identified patent and that said Letters Patent is hereby corrected as shown below:

Column 12,
Line 30, delete "claim 1,", and insert -- claim 17, --.
Lines 34 and 35, after "comprising:", insert -- a first prism; --.
Line 35, delete "spacial", and insert -- spatial --.
Line 35, after "modulator", delete ";", and insert -- positioned on one side of the first prism; --.
Line 36, delete the first instance of "a", and insert -- the --.
Line 38, delete "spacial", and insert -- spatial --.
Lines 38 and 39, delete "positioned on one side of the first prism".
Line 39, delete "spacial", and insert -- spatial --.
Line 40, after "modulator", insert -- being --.
Line 44, after "system", insert -- , positioned --.
Line 45, delete "spacial", and insert -- spatial --.
Lines 45 and 46 delete "[the projection optical system]".
Line 48, after the first instance of "prism", insert -- positioned --.
Line 59, delete "[a]".

Column 13,
Line 8, after "directed;", insert -- a first prism; -- and -- a second prism --.
Line 9, delete "a", and insert -- the --.
Line 9, after "prism", insert -- being --.
Line 15, delete "a", and insert -- the --.
Line 18, delete "a", and insert -- said --.

Signed and Sealed this

Twelfth Day of November, 2002

*Attest:*

JAMES E. ROGAN
*Attesting Officer*    *Director of the United States Patent and Trademark Office*

UNITED STATES PATENT AND TRADEMARK OFFICE
CERTIFICATE OF CORRECTION

PATENT NO.    : 6,376,878 B1
DATED         : April 23, 2002
INVENTOR(S)   : Christopher B. Kocon It is certified that error appears in the above-identified patent and that said Letters Patent is hereby corrected as shown below:

This certificate supersedes Certificates of Correction issued November 12, 2002 the number was erroneously mentioned and should be vacated since no Certificate of Correction was granted.

Signed and Sealed this

Twenty-first Day of January, 2003

JAMES E. ROGAN
*Director of the United States Patent and Trademark Office*